(12) United States Patent
Chen et al.

(10) Patent No.: US 8,283,574 B2
(45) Date of Patent: Oct. 9, 2012

(54) PRINTED CIRCUIT BOARD WITH COMPOUND VIA

(75) Inventors: Yung-Chieh Chen, Tu-Cheng (TW);
Cheng-Hsien Lee, Tu-Cheng (TW);
Po-Chuan Hsieh, Tu-Cheng (TW);
Shou-Kuo Hsu, Tu-Cheng (TW);
Shin-Ting Yen, Tu-Cheng (TW);
Dan-Chen Wu, Tu-Cheng (TW);
Jia-Chi Chen, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 108 days.

(21) Appl. No.: 13/031,617

(22) Filed: Feb. 22, 2011

(65) Prior Publication Data

US 2012/0145448 A1    Jun. 14, 2012

(30) Foreign Application Priority Data

Dec. 14, 2010   (TW) .................................. 99143664

(51) Int. Cl.
*H05K 1/11*    (2006.01)
(52) U.S. Cl. ......... 174/266; 174/262; 174/265; 361/767

(58) Field of Classification Search .......... 174/260–266; 361/760, 767
See application file for complete search history.

(56) References Cited

U.S. PATENT DOCUMENTS

| | | | | |
|---|---|---|---|---|
| 6,115,262 | A * | 9/2000 | Brunner et al. | 361/774 |
| 6,316,736 | B1 * | 11/2001 | Jairazbhoy et al. | 174/260 |
| 7,465,885 | B2 * | 12/2008 | Chi et al. | 174/260 |
| 7,619,168 | B2 * | 11/2009 | Togashi | 174/260 |
| 2001/0017768 | A1 * | 8/2001 | Rumsey | 361/760 |
| 2009/0266595 | A1 * | 10/2009 | Togashi | 174/260 |
| 2011/0278054 | A1 * | 11/2011 | Lee et al. | 174/260 |

* cited by examiner

*Primary Examiner* — Hoa C Nguyen
(74) *Attorney, Agent, or Firm* — Altis Law Group, Inc.

(57) ABSTRACT

A printed circuit board (PCB) with compound via includes a substrate and a pair of through holes passing through the substrate. The substrate includes a signal layer which is the top layer of the substrate, a first reference layer adjacent to the signal layer, and a second reference layer not adjacent to the signal layer. A first and a second pair of pads are mounted on the signal layer. Each of the through holes extends through the first pair of pads such that the through hole and the first pair of pads jointly form a compound via. A first reserved opening is formed on the first reference layer and corresponds to the first and the second pair of pads and the compound via. A second reserved opening is formed on the second reference layer and surrounds the through hole thereon.

6 Claims, 7 Drawing Sheets

PRINTED CIRCUIT BOARD WITH COMPOUND VIA

BACKGROUND

1. Technical Field

The present disclosure relates to a printed circuit board, and particularly to a printed circuit board with compound via.

2. Description of Related Art

With enhancement of data transmission speeds, the integrity of transmitted signals has become a priority in successful data transmission, as well as an essential consideration in the design of PCBs (printed circuit board). Factors such as the type of electronic components, the related parameters of the PCB, and the layout of the electronic components thereon can affect the integrity of transmitted signals. As a result, identification of affecting factors and what methods can be employed to minimize their effects effectively are critical. For PCBs, such factors include matching and continuity of impedance. If the impedance is not continuous, the quality of signals will be affected, and the efficiency of the entire system affected.

With concentration on minimization of device size and profile, via-on-pad structure is utilized in the PCB which has coexistence/in-coexistence wiring structure for high speed signal transmission. That is, a via is formed on an AC-coupling capacity pad to conserve wiring space. However, in comparison with transmission wires, the pads with via formed thereon exhibit greater electric capacity and lower impedance which present as impedance discontinuity. Consequently, the quality of the signals is affected. Particularly, with the increment of signal transmission speed in recent years, the problems caused by impedance discontinuity have become increasingly obvious.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
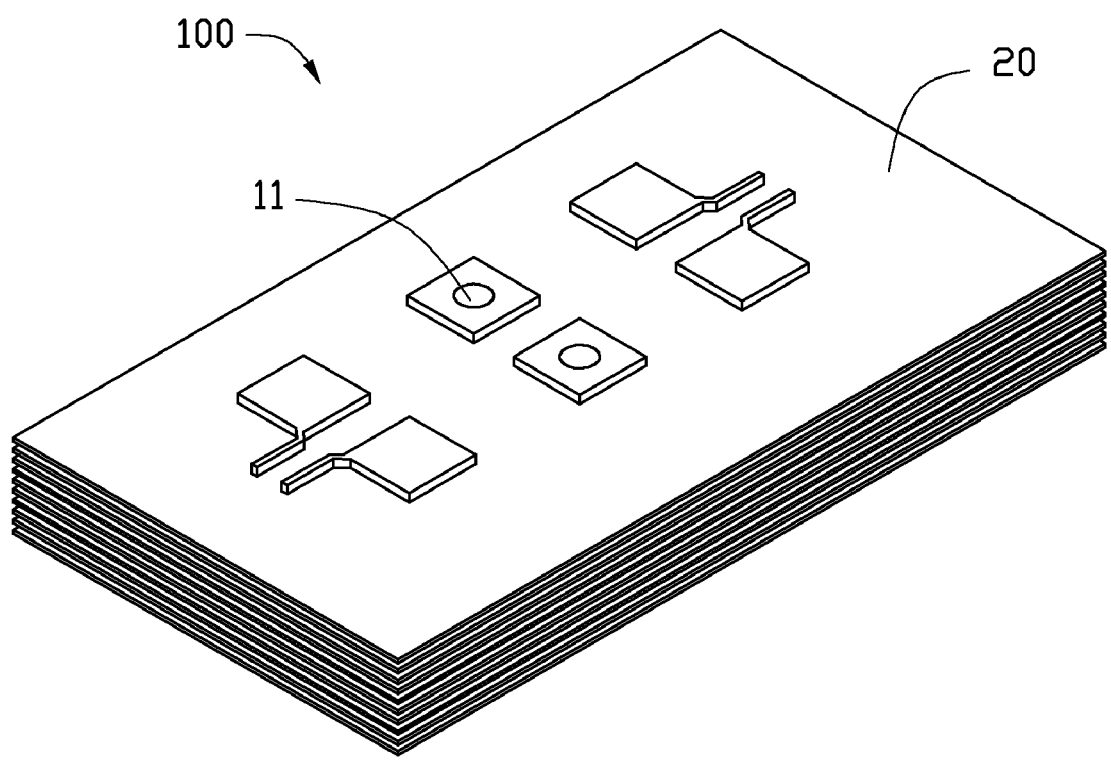
FIG. 1 is a schematic view of a preferred embodiment of a printed circuit board with compound via of the present disclosure.

As shown in FIG. 1 to FIG. 6, an embodiment of a printed circuit board 100 with compound via of the present disclosure includes a substrate 20 and a pair of through holes 11 passing through each layer of the substrate 20. In this embodiment, the substrate 20 includes ten layers, wherein the first layer 1, the third layer, the eighth layer and the tenth layer 10 are signal layers, and the second layer 2, the fourth layer 4, the fifth layer, the sixth layer, the seventh layer, and the ninth layer 9 are reference layers. The top of the through hole 11 is at the first layer 1, and the bottom thereof is at the tenth layer 10

Figure 2:
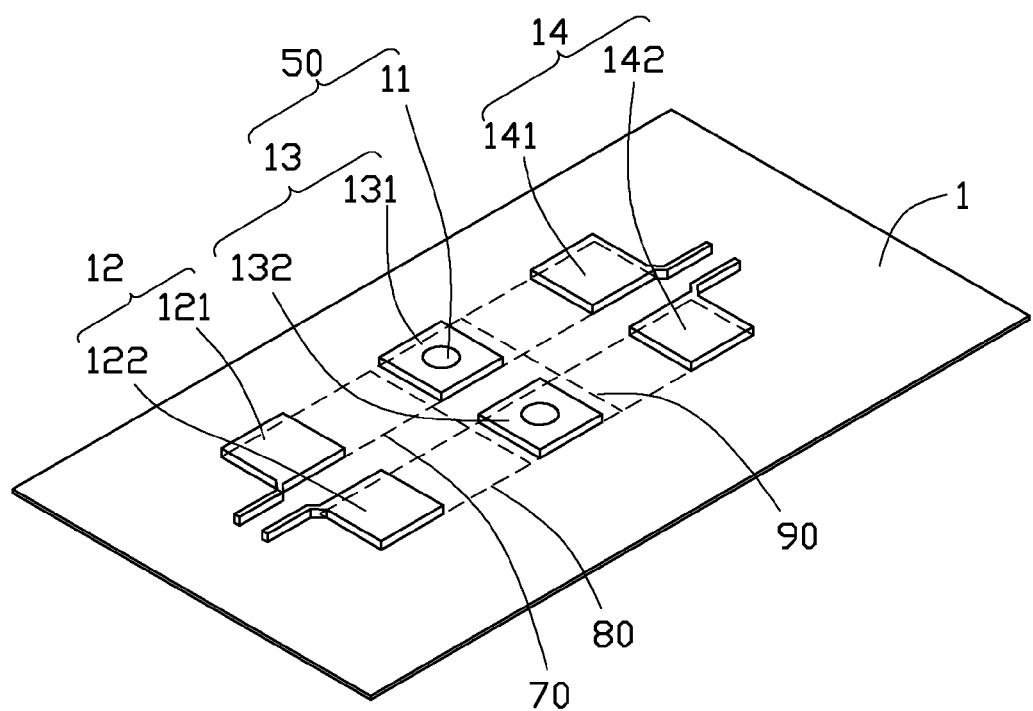
FIG. 2 is a schematic view of a first layer of the preferred embodiment of a printed circuit board with compound via of the present disclosure.
Figure 3:
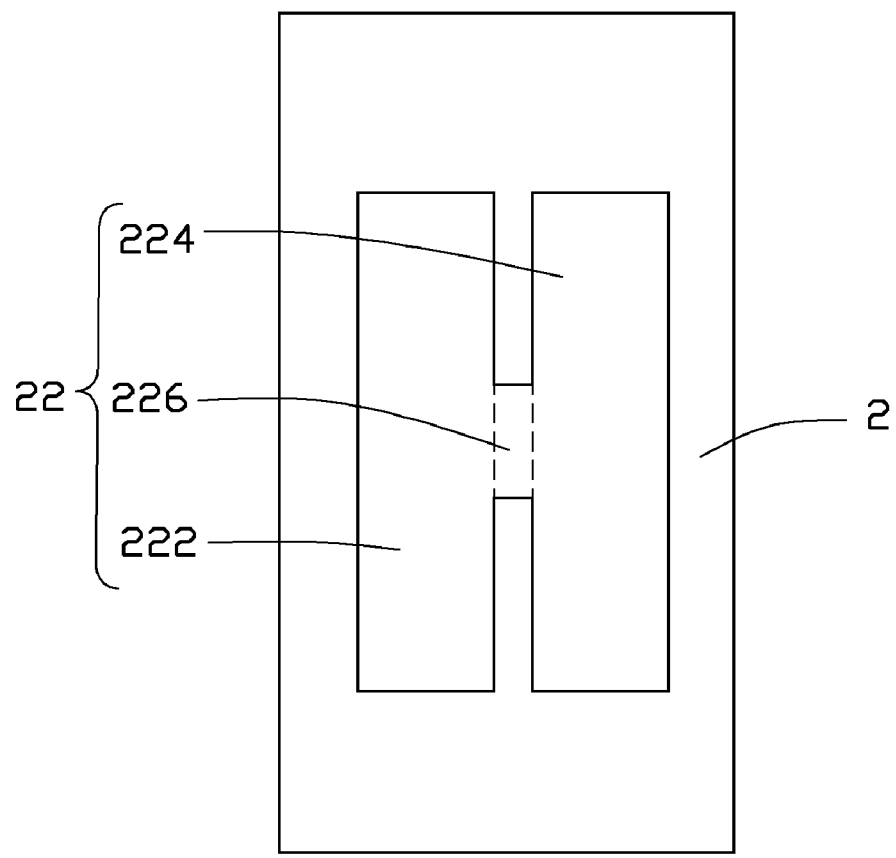
FIG. 3 is a schematic view of a reserved opening of a second layer of a printed circuit board with compound via of the present disclosure.

As shown in FIG. 2 and FIG. 3, the first layer 1 has a first pair to a third pair of pads 12-14 disposed thereon. The top of the through hole 11 passes through the second pair of pads 13. The second pair of pads 13 is between the first pair 12 and the third pair of pads 14. The second pair of pads 13 and the through hole 11 jointly form a first pair of compound vias 50. Electronic components such as capacitors can be selectively soldered on the first pair of pads 12 and the second pair of pads 13 or the second pair of pads 13 and the third pair of pads 14. The first pair of pads 12 includes a first pad 121 and a second pad 122. The second pair of pads 13 includes a third pad 131 and a fourth pad 132. The third pair of pads 14 includes a fifth pad 141 and a sixth pad 142. The first pad 121, the third pad 131, and the fifth pad 141 jointly form a first pad set. The second pad 122, the fourth pad 132, and the sixth pad 142 jointly form a second pad set.

The second layer 2 has a first reserved opening 22 with an H-like shape formed thereon. The first reserved opening 22 includes a first rectangular opening 222, a second rectangular opening 224, and a first communicating opening 226 communicating the central portion of the first rectangular opening 222 with that of the second rectangular opening 224. The normal projection of the first rectangular opening 222 on the first layer 1 overlaps a minimal rectangular area 70 capable of enclosing the first pad set. The normal projection of the second rectangular opening 224 on the first layer 1 overlaps a minimal rectangular area 80 capable of enclosing the second pad set. The normal projection of the first communicating opening 226 on the first layer 1 overlaps a portion of a minimal rectangular area 90 capable of enclosing the first pair of compound vias 50 between the minimal rectangular area 70 capable of enclosing the first pad set and the minimal rectangular area 80 capable of enclosing the second pad set.

Figure 4:
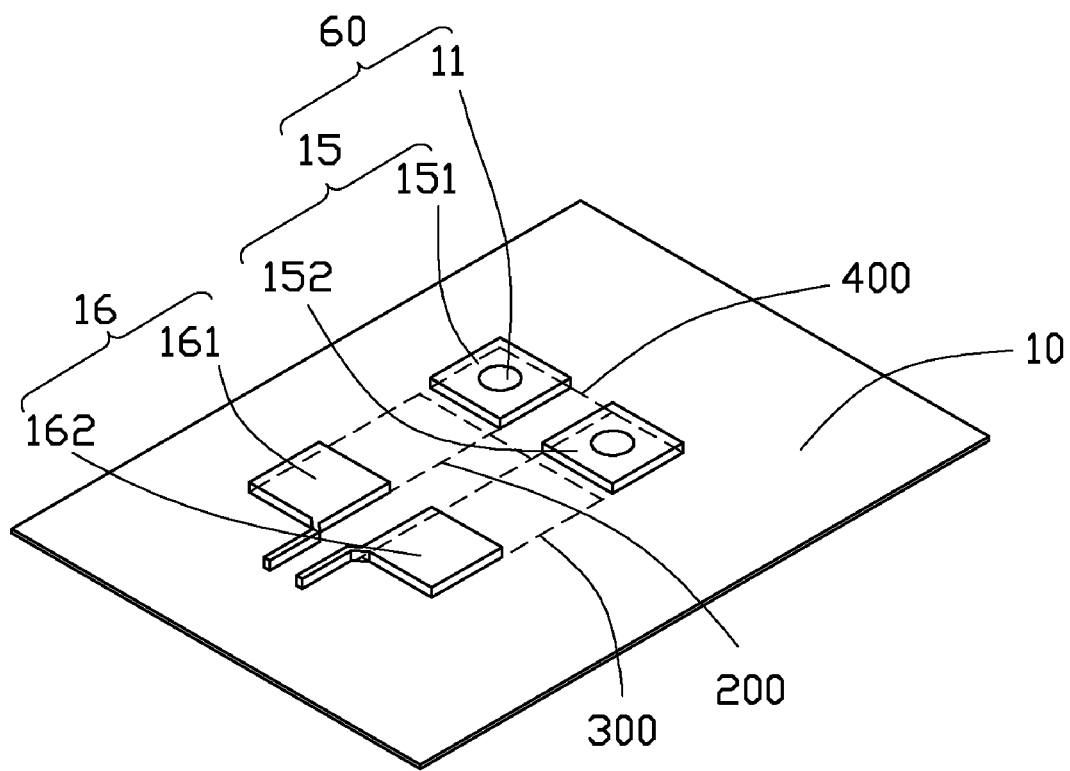
FIG. 4 is a schematic view of a tenth layer of a preferred embodiment of a printed circuit board with compound via of the present disclosure.
Figure 5:
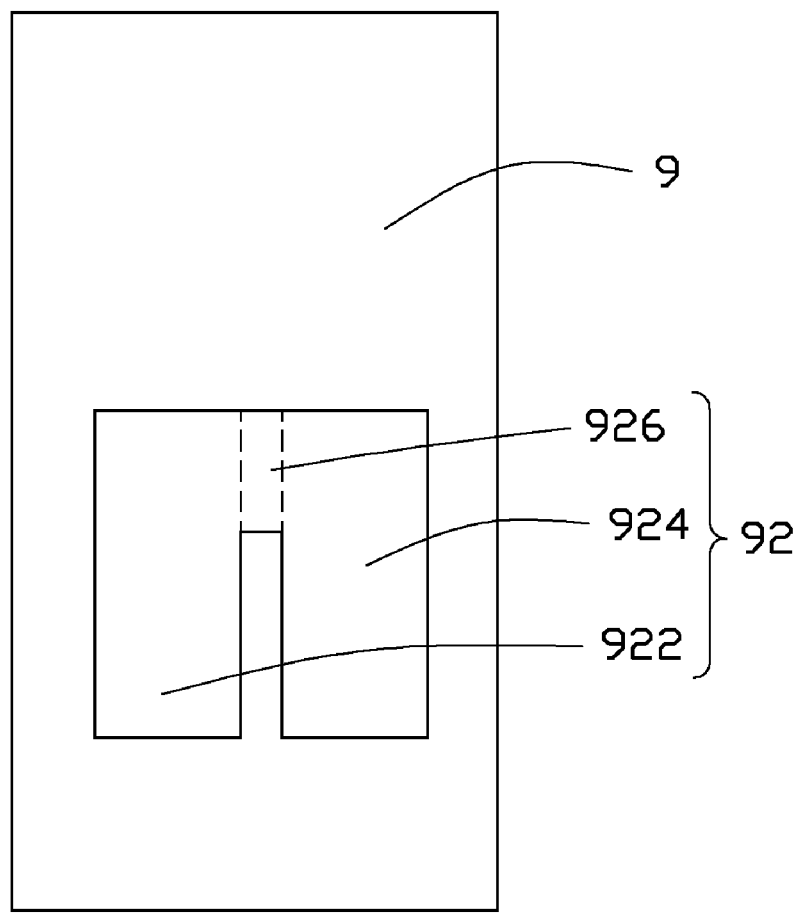
FIG. 5 is a schematic view of a reserved opening of a ninth layer of a printed circuit board with compound via of the present disclosure.

As shown in FIG. 4 and FIG. 5, the tenth layer has a fourth pair of pads 15 and a fifth pair of pads 16 mounted thereon. The bottom of the through hole 11 passes through the fourth pair of pads 15. The fourth pair of pads 15 and the through hole 11 jointly form a second pair of compound vias 60. Electronic component such as capacitor can be soldered on the fourth pair of pads 15 and the fifth pair of pads 16. The fourth pair of pads 15 includes a seventh pad 151 and an eighth pad 152. The fifth pair of pads 16 includes a ninth pad 161 and a tenth pad 162. The seventh pad 151 and the ninth pad 161 jointly form a third pad set. The eighth pad 152 and the tenth pad 162 jointly form a fourth pad set.

The ninth layer 9 has a second reserved opening 92 with an inverted U-shape formed thereon. The second reserved opening 92 includes a third rectangular opening 922, a fourth rectangular opening 924, and a second communicating opening 926 communicating the top portion of the third rectangular opening 922 with that of the fourth rectangular opening 924. The normal projection of the third rectangular opening 922 on the tenth layer 10 overlaps a minimal rectangular area 200 capable of enclosing the third pad set. The normal projection of the fourth rectangular opening 924 on the tenth layer 10 overlaps a minimal rectangular area 300 capable of enclosing the fourth pad set. The normal projection of the second communicating opening 926 on the tenth layer 10 overlaps a portion of a minimal rectangular area 400 capable of enclosing the second compound via 60 between the minimal rectangular area 200 capable of enclosing the third pad set and the minimal rectangular area 300 capable of enclosing the fourth pad set.

Figure 6:
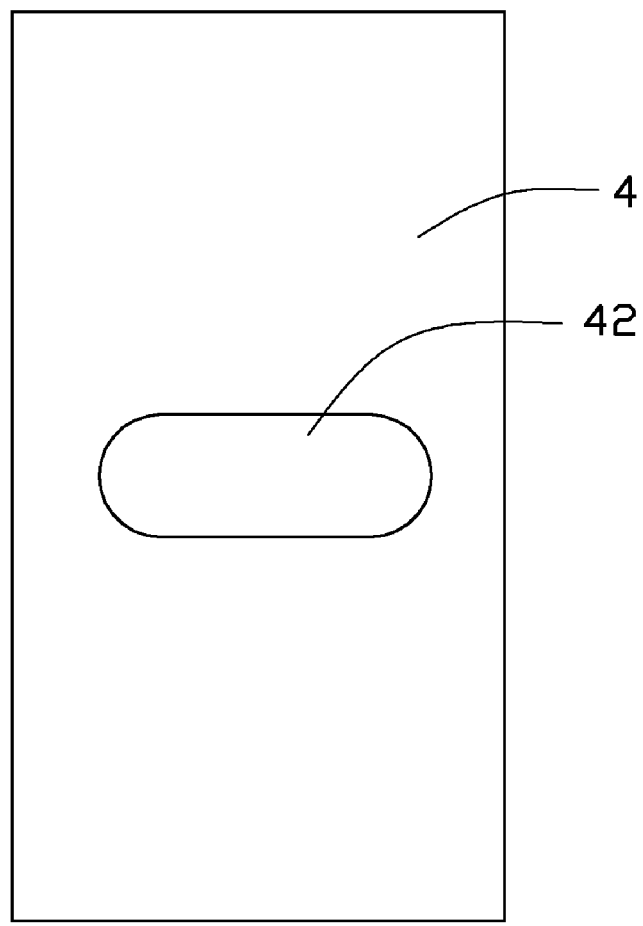
FIG. 6 is a schematic view of a fourth layer of a preferred embodiment of a printed circuit board with compound via of the present disclosure.

As shown in FIG. 6, the fourth to the seventh layers have the same structure, and the fourth layer is taken as reference. The fourth layer 4 has a third reserved opening 42 with an ellipse formed thereon. The third reserved opening 42 surrounds the through hole 11. Correspondingly, a fourth to a sixth reserved openings are formed on the fifth to the seventh layers, respectively. The fourth to the sixth reserved openings respectively surrounds the through hole 11.

In other embodiments, the number of the layers of the substrate 20 can be changed according to actual needs. The relative position of the signal layer and the reference layer can be changed according to demands. The shape of the first and the second reserved opening 22 and 92 can be adjusted to correspond to that of the pads and the through holes 11 on the first and the tenth layer which adjacent thereto after combination. In addition, when there is no pad disposed on the first layer, a reserved opening only encloses the through hole is formed on the second layer.

Figure 7:
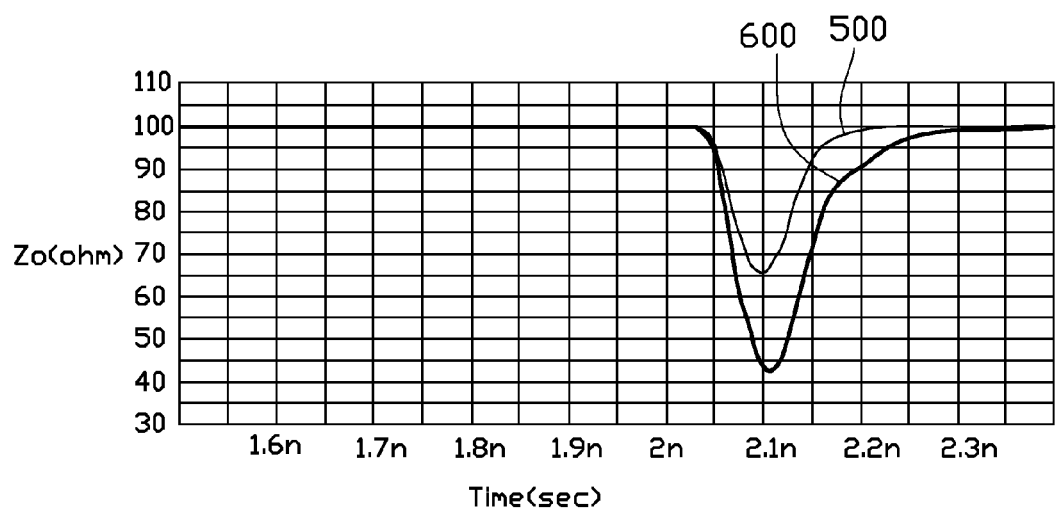
FIG. 7 is a curve diagram of the impedance of a printed circuit board with compound via of the present disclosure and a conventional printed circuit board with compound via generated by simulation.

FIG. 7 is a curve diagram of the impedance of a printed circuit board with compound via of the present disclosure and a conventional printed circuit board 100 with compound via generated by simulation, wherein the abscissa represents signal transmission time T (ns), and the ordinate represents impedance Z0 (Ω). As shown in FIG. 7, the first curve 500 represents the impedance of the printed circuit board 100 with compound via of the present disclosure generated by simulation shows a 65 Ω impedance at 2.1 ns, while the second curve 600 representing the impedance of conventional printed circuit board generated by simulation shows a 43 Ω impedance at t 2.1 ns. Therefore, in comparison with conventional printed circuit board, the impedance of the printed circuit board 100 with compound via of the present disclosure has a 34% enhancement, and the in-continuity of the impedance of pads and through holes are minimized effectively.

The printed circuit board with compound via as disclosed has a first reserved opening formed on a second layer adjacent to the first layer which is the top layer of a substrate, a second reserved opening formed on the ninth layer adjacent to the tenth layer, the bottom layer of the substrate 20, and the third to the sixth reserved openings surrounding the through hole 11 formed on the reference layers, i.e., the fourth to the seventh layers not adjacent to the first and the tenth layers, effectively minimizing the impedance discontinuity of a printed circuit board with compound via.

While the disclosure has been described by way of example and in terms of preferred embodiment, it is to be understood that the disclosure is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A printed circuit board with compound via, the printed circuit board comprising:
 a substrate including:
  a signal layer, wherein the signal layer is the top layer of the substrate;
  a first and a second reference layer, wherein the first reference layer with a first reserved opening formed thereon is adjacent to the signal layer, the second reference layer is not adjacent to the signal layer, wherein the first reserved opening includes a first rectangular opening, a second rectangular opening, and a first communicating opening communicating the first rectangular opening with the second rectangular opening, the normal projection of the first rectangular opening on the signal layer overlaps a minimal rectangular area capable of enclosing the first pad set, the normal projection of the second rectangular opening on the signal layer overlaps a minimal rectangular area capable of enclosing the second pad set; and
  a first and a second pair of pads mounted on the signal layer for soldering electronic components, wherein the first pair of pads includes a first pad and a second pad, the second pair of pads includes a third pad and a fourth pad, the first pad and the third pad jointly form a first pad set, the second pad and the fourth pad jointly form a second pad set; and
 a pair of through holes passing through the substrate, wherein each of the through holes passes through the first pair of pads such that the through hole and the first pair of pads jointly form a pair of compound vias, the normal projection of the first communicating opening on the signal layer overlaps a portion of a minimal rectangular area capable of enclosing the pair of compound vias between the minimal rectangular area capable of enclosing the first pad set and the minimal rectangular area capable of enclosing the second pad set.

2. The printed circuit board of claim 1, wherein the first reserved opening forms an inverted U-shape.

3. A printed circuit board with compound via, the printed circuit board comprising:
 a substrate including:
  a first signal layer, wherein the first signal layer is the top layer of the substrate;
  a first and a second reference layer, wherein the first reference layer with a first reserved opening formed thereon is adjacent to the first signal layer, the second reference layer is not adjacent to the first signal layer, wherein the first reserved opening includes a first rectangular opening, a second rectangular opening, and a first communicating opening communicating the first rectangular opening with the second rectangular opening, the normal projection of the first rectangular opening on the signal layer overlaps a minimal rectangular area capable of enclosing the first pad set, the normal projection of the second rectangular opening on the signal layer overlaps a minimal rectangular area capable of enclosing the second pad set; and
  a first to a third pair of pads mounted on the first signal layer for soldering electronic components, wherein the first pair of pads includes a first pad and a second pad, the second pair of pads includes a third pad and a fourth pad, the third pair of pads includes a fifth pad and a sixth pad, the first pad, the third pad, and the fifth pad jointly form a first pad set, the second pad, the fourth pad, and the sixth pad jointly form a second pad set; and
 a pair of through holes passing through the substrate, wherein each of the through holes passes through the second pair of pads such that the through hole and the second pair of pads jointly form a pair of compound vias, the normal projection of the first communicating opening on the first signal layer overlaps a portion of a minimal rectangular area capable of enclosing the pair of compound vias between the minimal rectangular area capable of enclosing the first pad set and the minimal rectangular area capable of enclosing the second pad set.

4. The printed circuit board of claim 3, wherein the first reserved opening forms a H-shape.

5. The printed circuit board of claim 3, wherein the substrate includes ten layers, the first layer is the first signal layer, the second layer is the first reference layer, the third layer is a second signal layer, the eighth layer is a third signal layer, the tenth layer is a fourth signal layer and is the bottom layer of the substrate, the fourth layer is the second reference layer, the fifth to the seventh layers and the ninth layer are a third reference layer to a sixth reference layers, respectively, the tenth layer has a fourth and a fifth pair of pads mounted thereon, the bottom of the through hole passes through the fourth pair of pads such that the through hole and the fourth pair of pads jointly form a second pair of compound vias, wherein the fourth pair of pads includes a seventh pad and a eighth pad, the fifth pair of pads includes a ninth pad and a tenth pad, the seventh pad and the ninth pad jointly form a third pad set, the eighth pad and the tenth pad jointly form a fourth pad set, a second reserved opening is formed on the ninth layer, the second reserved opening includes a third rectangular opening, a fourth rectangular opening, and a second communicating opening communicating the third rectangular opening with the fourth rectangular opening, the normal projection of the third rectangular opening on the tenth layer overlaps a minimal rectangular area capable of enclosing the third pad set, the normal projection of the fourth rectangular opening on the tenth layer overlaps a minimal rectangular area capable of enclosing the fourth pad set, the normal projection of the second communicating opening on the tenth layer overlaps a portion of a minimal rectangular area capable of enclosing the second pair of compound vias between the minimal rectangular area capable of enclosing the third pad set and the minimal rectangular area capable of enclosing the fourth pad set.

6. The printed circuit board of claim 5, wherein the second reserved opening forms an inverted U-shape.

* * * * *